(12) United States Patent
Van Gaal

(10) Patent No.: US 9,622,388 B1
(45) Date of Patent: Apr. 11, 2017

(54) MULTI-DIRECTIONAL FANS IN AN ELECTRONIC CHASSIS SUPPORTING EXTENDED RANGE TEMPERATURE OPERATION

(71) Applicant: Ciena Corporation, Hanover, MD (US)

(72) Inventor: Adrianus Van Gaal, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/019,991

(22) Filed: Feb. 10, 2016

(51) Int. Cl.
*H05K 7/20* (2006.01)
*H01L 23/473* (2006.01)

(52) U.S. Cl.
CPC ..... *H05K 7/20736* (2013.01); *H05K 7/20836* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 5,545,494 A | 8/1996 | Trumble et al. | | |
| 5,552,961 A | 9/1996 | Van Gaal et al. | | |
| 5,796,580 A * | 8/1998 | Komatsu | ............ | H05K 7/20727 361/679.47 |
| 6,537,019 B1 * | 3/2003 | Dent | ............ | F04D 25/166 361/679.48 |
| 6,833,991 B2 | 12/2004 | Van Gaal | | |
| 6,997,006 B2 * | 2/2006 | Kameyama | ............ | F24F 1/022 361/688 |
| 7,499,276 B2 * | 3/2009 | Cole | ............ | G07F 9/10 361/690 |
| 9,052,483 B2 | 6/2015 | Nguyen | | |
| 9,203,782 B2 | 12/2015 | Mayenburg et al. | | |
| 2004/0016257 A1 * | 1/2004 | Wei | ............ | F28D 1/0477 62/259.2 |
| 2008/0007911 A1 * | 1/2008 | Hallin | ............ | G06F 1/181 361/679.47 |
| 2008/0186672 A1 * | 8/2008 | Lanus | ............ | G06F 11/3058 361/679.48 |
| 2008/0225481 A1 * | 9/2008 | Anderl | ............ | H05K 7/20727 361/695 |

(Continued)

*Primary Examiner* — Anthony Haughton
*Assistant Examiner* — Razmeen Gafur
(74) *Attorney, Agent, or Firm* — Clements Bernard Walker PLLC; Christopher L. Bernard; Lawrence A. Baratta, Jr.

(57) ABSTRACT

Systems and methods for providing airflow in an electronic chassis supporting operation in an extended temperature range for components therein include providing airflow in a first configuration in high-temperature operation; and providing airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range.

18 Claims, 5 Drawing Sheets

(56) References Cited

U.S. PATENT DOCUMENTS

| | | | |
|---|---|---|---|
| 2009/0097202 A1* | 4/2009 | Gipson | B01D 46/0067 361/695 |
| 2009/0097204 A1* | 4/2009 | Byers | H05K 7/20572 361/695 |
| 2010/0172098 A1* | 7/2010 | Isoshima | H05K 7/20972 361/697 |
| 2010/0188817 A1* | 7/2010 | Chou | H01L 23/467 361/697 |
| 2011/0292604 A1* | 12/2011 | Janes | H05K 7/20909 361/695 |
| 2012/0327586 A1* | 12/2012 | Sun | G06F 1/20 361/679.33 |
| 2013/0222999 A1* | 8/2013 | Wiltzius | G06F 1/20 361/679.31 |
| 2013/0242542 A1* | 9/2013 | Uchimi | H05K 7/20136 362/97.1 |
| 2014/0002987 A1* | 1/2014 | Okitsu | G06F 1/206 361/679.48 |
| 2014/0036439 A1* | 2/2014 | Huang | H05K 7/20727 361/692 |
| 2014/0118926 A1* | 5/2014 | Santos | G06F 1/20 361/679.48 |
| 2014/0233173 A1* | 8/2014 | Matsushita | H05K 7/20836 361/679.46 |
| 2014/0321061 A1 | 10/2014 | Moore et al. | |
| 2015/0092348 A1 | 4/2015 | Newhouse et al. | |
| 2015/0147951 A1* | 5/2015 | Funada | H05K 7/20136 454/184 |
| 2015/0173252 A1* | 6/2015 | Zeighami | H05K 7/20781 340/606 |
| 2015/0250077 A1* | 9/2015 | Endo | H05K 7/20745 361/679.47 |
| 2015/0319883 A1* | 11/2015 | Branton | H05K 7/20754 361/679.53 |
| 2016/0050796 A1* | 2/2016 | Mayenburg | H05K 5/0213 361/679.48 |

\* cited by examiner

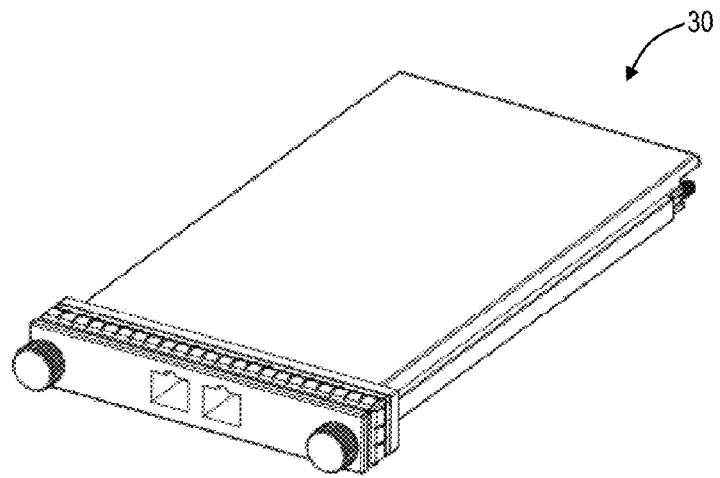
FIG. 2
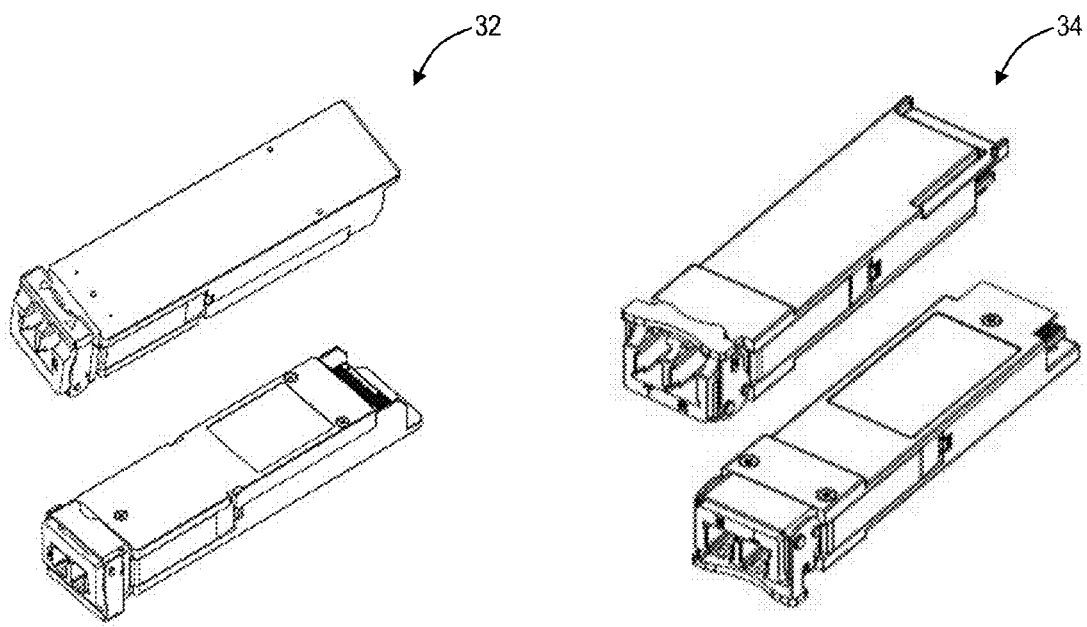
FIG. 3  FIG. 4

MULTI-DIRECTIONAL FANS IN AN ELECTRONIC CHASSIS SUPPORTING EXTENDED RANGE TEMPERATURE OPERATION

FIELD OF THE DISCLOSURE

The present disclosure generally relates to network hardware systems and methods. More particularly, the present disclosure relates to multi-directional fans in an electronic chassis supporting extended range temperature operation, such as for optical modules.

BACKGROUND OF THE DISCLOSURE

Conventional networking hardware is engineered and designed to operate in an extended temperature range such as −40° C. to +65° C. Due to this extended temperature range, optical components in conventional networking hardware is required to operate over the same or a larger range such as −40° C. to +85° C. This scheme worked for existing pluggable optical transceivers which support these extended temperature ranges. For 100 Gb/s and higher optical components, the extended temperature range is only supported in large, expensive modules, such as CFP (C Small Form Factor Pluggable) modules. Using these larger, expensive modules significantly increases the size and cost of the electronic chassis, while also reducing overall system density. Emerging small form factor packages for 100 Gb/s and higher optical modules, such as CFP4 (C Small Form Factor Pluggable 4), QSFP (Quad Small Form Factor Pluggable), and the like, are only available in limited temperature ranges such as 0° C. to +70° C. Thus, use of these small form factor packages would limit the overall temperature range of networking hardware.

BRIEF SUMMARY OF THE DISCLOSURE

In an exemplary embodiment, a method of providing airflow in an electronic chassis supporting operation in an extended temperature range for components therein includes providing airflow in a first configuration in high-temperature operation; and providing airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range. The airflow in the second configuration can be provided first over heat-generating electronics before being provided to the one or more components, to heat the one or more components in the low-temperature operation. The airflow in the first configuration can be provided by a first set of fans and the airflow in the second configuration can be provided by a second set of fans. The first set of fans can be located at a rear section of the electronic chassis and is configured to draw air from a front of the electronic chassis through an interior of the electronic chassis, and wherein the second set of fans can be located in the interior configured to draw air from the interior and exhaust air in the front. The second set of fans can be coupled to an air duct with an air turning foil to guide air firstly over heat-generating electronics and secondly over the one or more components. The airflow in the first configuration can be provided by a set of fans operating in a forward direction and the airflow in the second configuration can be provided by the set of fans operating in a reverse direction. The one or more components can include optical modules including one of a C Small Form Factor Pluggable 4 (CFP4) and a Quad Small Form Factor Pluggable (QSFP). The preheated air can be preheated by one or more of electronics in the electronic chassis and a heater. The limited temperature range is a smaller range than the extended temperature range, and wherein the second configuration extends the limited temperature range to the extended temperature range.

In another exemplary embodiment, an electronic chassis adapted to support operation in an extended temperature range for components therein includes a first set of fans adapted to provide airflow in a first configuration in high-temperature operation; and a second set of fans adapted to provide airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range. The airflow in the second configuration can be provided first over heat-generating electronics before being provided to the one or more components, to heat the one or more components in the low-temperature operation. The first set of fans can be located at a rear section of the electronic chassis and can be configured to draw air from a front of the electronic chassis through an interior of the electronic chassis, and wherein the second set of fans can be located in the interior configured to draw air from the interior and exhaust air in the front. The second set of fans can be coupled to an air duct with an air turning foil to guide air firstly over heat-generating electronics and secondly over the one or more components. The one or more components can include optical modules including one of a C Small Form Factor Pluggable 4 (CFP4) and a Quad Small Form Factor Pluggable (QSFP). The preheated air can be preheated by one or more of electronics in the electronic chassis and a heater. The limited temperature range is a smaller range than the extended temperature range, and wherein the second configuration extends the limited temperature range to the extended temperature range.

In a further exemplary embodiment, an apparatus adapted to provide airflow in an electronic chassis supporting operation in an extended temperature range for components therein includes circuitry adapted to cause airflow in a first configuration in high-temperature operation; and circuitry adapted to cause airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range. The airflow in the second configuration can be provided first over heat-generating electronics before being provided to the one or more components, to heat the one or more components in the low-temperature operation. The airflow in the first configuration can be provided by a first set of fans and the airflow in the second configuration can be provided by a second set of fans. The airflow in the first configuration can be provided by a set of fans operating in a forward direction and the airflow in the second configuration can be provided by the set of fans operating in a reverse direction.

BRIEF DESCRIPTION OF THE DRAWINGS

The present disclosure is illustrated and described herein with reference to the various drawings, in which like reference numbers are used to denote like system components/ method steps, as appropriate, and in which:

FIG. 2 is a perspective diagram of a CFP module;

FIG. 3 is a perspective diagram of a CFP4 module;

FIG. 4 is a perspective diagram of a QSFP module;

DETAILED DESCRIPTION OF THE DISCLOSURE

In various exemplary embodiments, multi-directional fan systems and methods are described in an electronic chassis supporting extended range temperature operation, such as for optical modules. The systems and methods include multiple fans that can change the direction of airflow to allow for airflow over optical components first, operating at high temperature, and for airflow over electronic components first, operating at low temperature, where the electronic components preheat the airflow (also the airflow can be preheated with heaters) before passing over the optical components. That is, the multi-directional fans can cool both electronics and optical components with a first set of fans operating in one temperature range (i.e., high temperature operation) and change airflow using a second set of fans and take hot air from the electronics or heaters and route it over the optical components in another temperature range (i.e., low temperature operation). Stated differently, the systems and methods include changing the direction of airflow over optical components to have unheated ambient air over the optical components when the ambient air temperature is high and pre-heated air from electronics and or heaters when the ambient air temperature is low. In an exemplary embodiment, the first set of fans is used in high-temperature operation and the second set of fans is used in low-temperature operation. Thus, the systems and methods contemplate in part using fans actually to heat up the optical components, with the second set of fans in the low-temperature operation. Accordingly, the optical components can operate in an extended temperature range. In an exemplary embodiment, the systems and methods are useful for small form factor optical components (e.g., CFP4. QSFP, etc.) which support a limited temperature range (e.g., 0° C. to +70° C.) to enable operation of the small form factor optical components in an extended temperature range (e.g., −40° C. to +65° C.), i.e., the extended temperature range is larger in size than the limited temperature range, but not necessarily greater.

Figure 1:
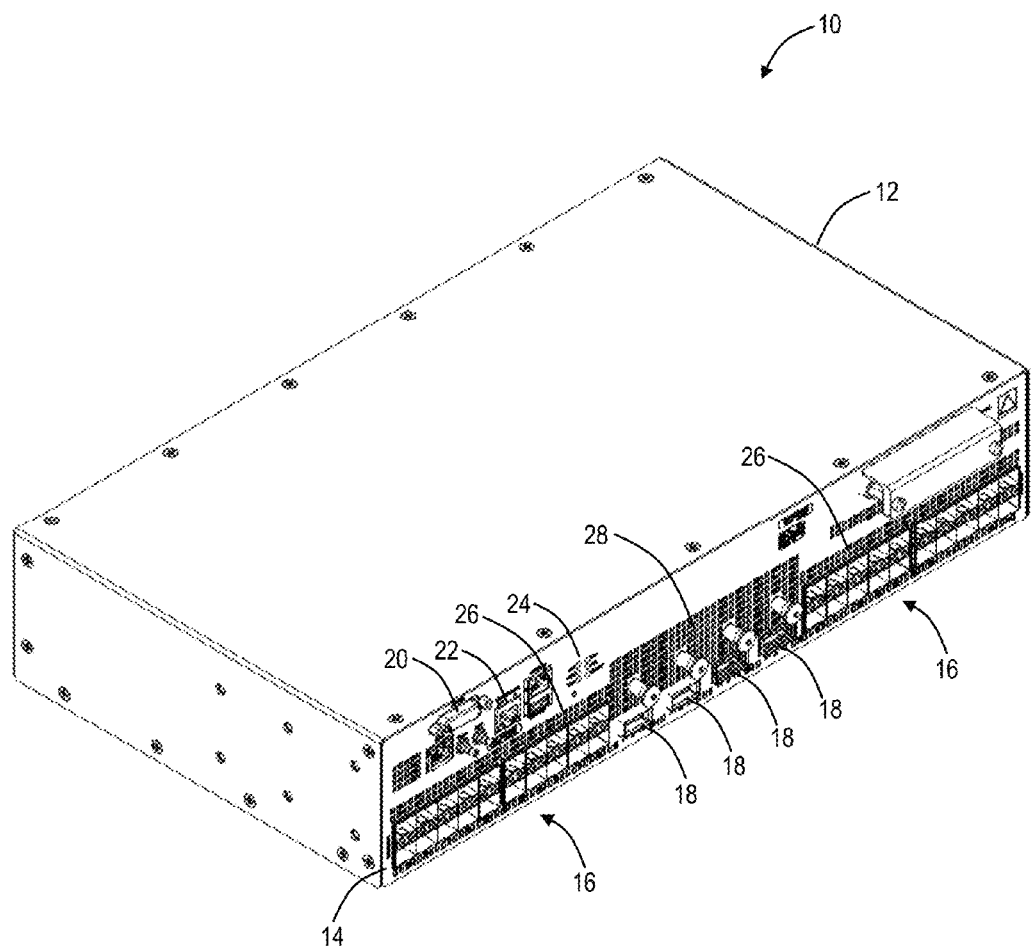
FIG. 1 is a perspective diagram of a network element for describing the multi-directional fan systems and methods.

Referring to FIG. 1, in an exemplary embodiment, a perspective diagram illustrates a network element 10 for describing the multi-directional fan systems and methods. The network element 10 is, for example, a 2 Rack Unit (RU) chassis with a physical housing 12 adapted to mount in a rack or frame. Note, other sizes besides 2RU are also contemplated by the systems and methods. In various exemplary embodiments, the network element 10 can be a switch, router, aggregation device, Multi-Service Provisioning Platform (MSPP), or the like. For example, a front face 14 of the physical housing 12 can include various ports 16, 18 for connectivity. The front face 14 can also include Operations, Administration, Maintenance, and Provisioning (OAM&P) ports such as a serial interface 20, an Ethernet port 22, status indicators 24 (such as Light Emitting Diodes), and the like. Additionally, the front face 14 can include air intake openings 26, 28. In the exemplary network element 10, airflow is from front to back, via the openings 26, 28. For example, the openings 26 can provide airflow over the ports 16 and associated components and the openings 28 can provide airflow over the ports 18 and associated components.

In the example of FIG. 1, the ports 16 are for low-speed optical interconnection via pluggable optical transceivers such as XFPs (10 Gigabit Small Form Factor Pluggable) or the like. The pluggable optical transceivers associated with the ports 16 are small form factor modules and can operate in the extended temperature range. The ports 18 are for high-speed optical interconnections such as small form factor 100 Gb/s and above. In an exemplary embodiment, the ports 18 support CFP4 or QSFP compliant modules. Disadvantageously, the high-speed optical interconnections in the ports 18 do not support extended temperature range, i.e., these small form factor modules (e.g., CFP4, QSFP, etc.) support the limited temperature range. As such, the network element 10, without the systems and methods, is constrained to operate in the limited temperature range only due to the presence of these modules in the port 18. Accordingly, the objective of the systems and methods is to enable extended temperature range operation of the small form factor modules in the ports 18 by changing the direction of airflow over the small form factor modules in the ports 18 to have unheated ambient air over the small form factor modules in the ports 18 when the ambient air temperature is high and pre-heated air from electronics and or heaters when the ambient air temperature is low.

Those of ordinary skill in the art will recognize the network element 10 is described for illustration purposes of the multi-directional fan systems and methods. Those of ordinary skill in the art will recognize the multi-directional fan systems and methods contemplate any network element or chassis where it is desired to extend the temperature range operation from the limited temperature range operation to the extended temperature range operation. Accordingly, small form factor high-speed optical transceivers (e.g., CFP4, QSFP, etc.), in the port 18, are one such example.

Referring to FIGS. 2, 3, and 4, in an exemplary embodiment, perspective diagrams illustrate a CFP module 30 (FIG. 2), a CFP4 module 32 (FIG. 3), and a QSFP module 34. The CFP4 module 32 or the QSFP module 34 can be selectively plugged into the ports 18. In an exemplary embodiment, the multi-directional fan systems and methods enable the CFP4 module 32, the QSFP module 34, and the like to operate in the extended temperature range. The CFP Multi-Source Agreement (MSA) defines hot-pluggable optical transceiver form factors to enable 40 Gb/s and 100 Gb/s applications, including next-generation High-Speed Ethernet (40 GbE and 100 GbE). Pluggable CFP, CFP2 and CFP4 transceivers support the ultra-high bandwidth requirements of data communications and telecommunication networks that form the backbone of the internet. CFP4 is defined by the CFP MSA in "CFP4 Hardware Specification," Revision 1.1, 18 Mar. 2015, available online at www.cfp-msa.org/Documents/ CFP-MSA_CFP4 HW-Spec-rev1.1.pdf, the contents of which are incorporated by reference herein. Other, emerging variants of CFP are also contemplated by the CFP4 module 32. Again, the CFP module 30 are available in the extended temperature range, but the CFP4 module 32 is only available in the limited temperature range. Note, the CFP4 module 32 is approximately one-fourth the size of the CFP module 30. It would be advantageous from a cost and density perspective to support the CFP4 module 32 in the extended temperature range.

The QSFP module 34 is a compact, hot-pluggable transceiver used for data communications applications which interface networking hardware to a fiber optic cable or active or passive electrical copper connection. The QSFP module 34 provides data rates from 4×10 Gb/s as well as higher data rates; as of May 2013, the highest possible rate is 4×28 Gb/s (also known as QSFP28). QSFP is defined by the SFF committee in SFF-8635 "QSFP+4×10 Gb/s Pluggable Transceiver Solution (QSFP10)," Rev. 0.6, 29 Jun. 2015, and SFF-8665 "QSFP+28 Gb/s 4× Pluggable Transceiver Solution (QSFP28)," Rev. 1.9, 29 Jun. 2015, the contents of each is incorporated by reference herein. Other, emerging variants of QSFP are also contemplated herein for the QSFP module 34. The QSFP specification accommodates Ethernet, Fibre Channel, InfiniBand and SONET/SDH standards with different data rate options. QSFP+ transceivers are designed to carry Serial Attached SCSI, 40 G Ethernet (100 G using QSFP28), QDR (40 G) and FDR (56 G) Infiniband, and other communications standards. QSFP modules increase the port density by 3×-4× compared to SFP+ modules.

Figure 5:
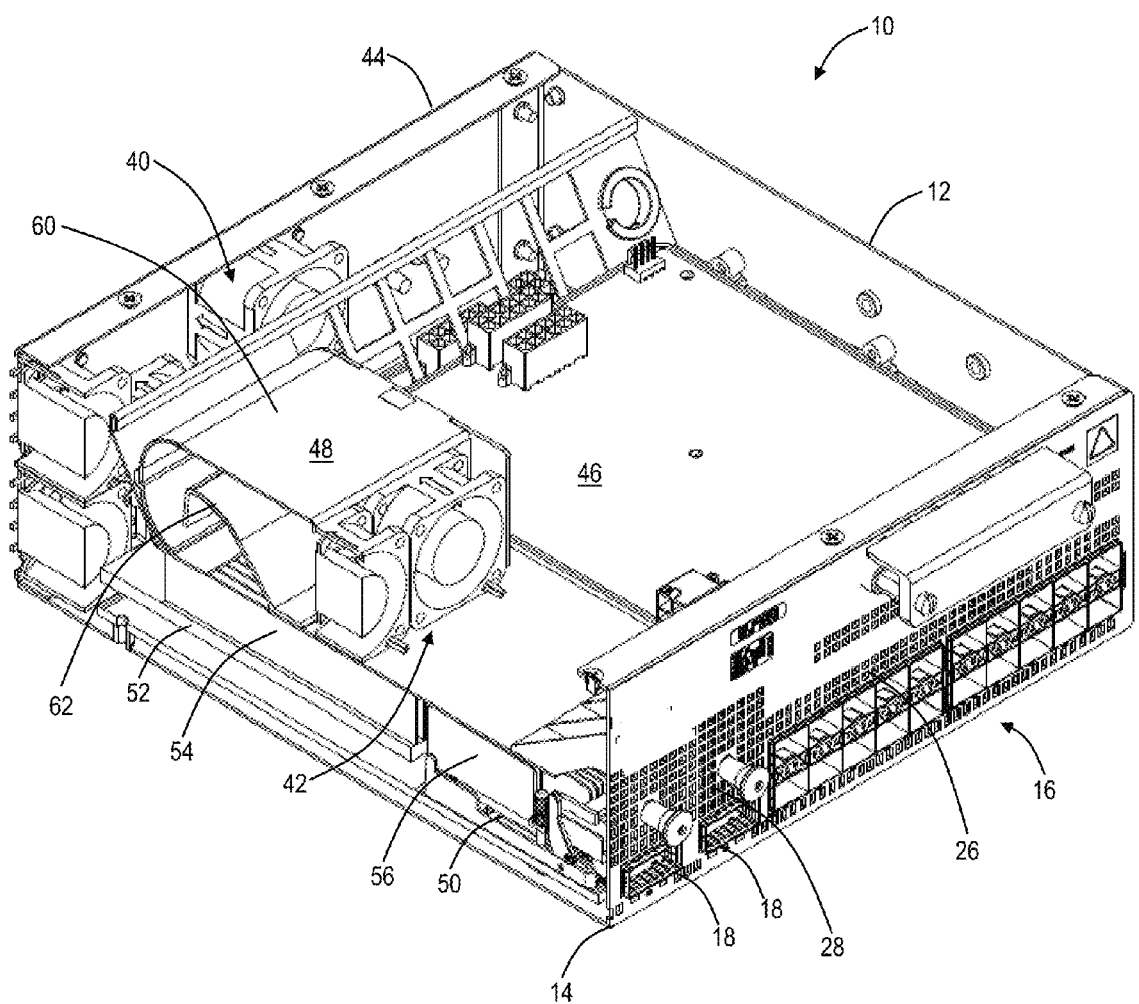
FIG. 5 is a perspective diagram of an interior, cross-sectional view of the network element of FIG. 1 for describing the multi-directional fan systems and methods.

Referring to FIG. 5, in an exemplary embodiment, a perspective diagram illustrates an interior, cross-sectional view of the network element 10 for describing the multi-directional fan systems and methods. Specifically, FIG. 5 illustrates the right side of the network element 10 from FIG. 1 with the top cover removed and the view illustrating half of the network element 10. The network element 10 includes two sets of fans 40, 42. The first set of fans 40 are located at a rear section 44 of the physical housing 12 and adapted to create an airflow from the openings 26, 28 through an interior 46 of the physical housing 12 and out the rear section 44. The second set of fans 42 are located in a middle portion 48 of the physical housing 12 and adapted to create an airflow from the internal air in the interior 46 and direct the internal air over one or more optical modules 50, in the ports 18. Again, the internal air is first drawn from the interior 46 and also flows first over electronics on a circuit board 52 before flowing over the optical modules 50 and out the openings 28. The network element 10 also includes an electronics heatsink 54, disposed to the electronics on the circuit board 52, and an optics heatsink 56 associated with the optical module 50. Again, in an exemplary embodiment, the optical module 50 is a CFP4, QSFP, or the like.

In an exemplary embodiment, the first set of fans 40 is forward airflow fans meaning the fans 40 bring airflow from the front face 14. The second set of fans 42 are reverse airflow fans meaning the fans 42 bring airflow from the interior 46 (as well as drawing external air), circulate the airflow over the electronics on the circuit board 52 over the optical module 50, in the port 18, and out the front face 14, through the opening 28. Thus, collectively, the sets of fans 40, 42 are multi-directional fans.

The first set of fans 40 is typical of a conventional network element where airflow is through the interior 46. Specifically, the airflow created by the first set of fans 40 includes external air drawn in through the openings 26, 28. The airflow is drawn in from the openings 26, 28 through the interior 46, from the front face 14 to the rear section 44 where the first set of fans 40 are located. Thus, the first set of fans 40 brings external air from the network element 10 which is air ambient room temperature to cool the various components in the interior 46. The first set of fans 40 is used for cooling in high-temperature operation, such as when the ambient temperature inside the interior 46 is above 10° C.

The second set of fans 42 can provide a different airflow from the first set of fans 40. In an exemplary embodiment, only one set of the fans 40, 42 can be operational at a time, based on the temperature regime. For example, the second set of fans 42 is used for airflow in a low-temperature regime, such as when the ambient temperature inside the interior is below 10° C. Note, there can be a hysteresis when switching between the operation of the fans 40, 42 to prevent switching back and forth between the fans 40, 42 when the ambient temperature is at or around the threshold between the low-temperature regime and the high-temperature regime. For example, switching between the first set of fans 40 and the second set of fans 42 can be only after the ambient temperature is a specific amount over or below the threshold for a predetermined time (e.g., ±5° C. for X minutes). The objective is not continuously to switch between the sets of fans 40, 42.

The second set of fans 42 are located in the interior 46 and configured to provide airflow to an air duct 60 with an air turning foil 62 contained therein. Again, the second set of fans 42 is configured to draw in ambient air from the interior 46 and the openings 26, 28. The first set of fans 40 are located at the rear section 44, thus, they do not require mechanical components to direct the associated airflow based on their location. Since the second set of fans 42 are located in the interior 46, the air duct 60 and the air turning foil 62 are configured to direct the associated airflow. The second set of fans 42 is positioned such that airflow output enters the air duct 60 and the air turning foil 62 are positioned such that the airflow output is turned and directed over the electronics on the circuit board 52 and then over the optical modules 50 and out the openings 28.

In low-temperature operation, the second set of fans 42 is configured to draw in the ambient air from the interior 46 as well as ambient air from outside the network element 10 such as through the openings 26, and to exhaust air through the openings 28. In high-temperature operation, the first set of fans 40 is configured to draw in ambient air from outside the network element 10 through the openings 26, 28. Note, the ambient air from outside the network element 10 is at a lower temperature than the ambient air from the interior 46. Thus, in the low-temperature operation, the second set of fans 42 can use the higher temperature ambient air from the interior 46 to heat the optical modules 50 as well as cool the electronics on the circuit board 52.

The second set of fans 42 can include preheated air, i.e., the existing ambient air in the interior 46 as well as heat obtained as the directed airflow passes over the electronics on the circuit board 52. By preheating the air before it passes over the optical modules 50, the systems and methods can keep the optical modules 50 warm in a −40° C. ambient environments, i.e., the low-temperature operation. Note, it is not possible to always operate with the second set of fans 42, i.e., to always operate with the air exhausting from the openings 28. This creates problems for sufficient cooling of the interior 46 at high temperature, i.e., the high-temperature operation. By changing the air direction in the interior, the systems and methods are optimized for both extremes, the high-temperature operation, and the low-temperature operation. Again, the multi-directional fan systems and methods address the issue of using commercial optics, such as the optical module 50 (e.g., CFP4, QSFP, etc.), in the extended temperature range. That is, the different operation of cooling via the fans 40, 42 enable operation in the high-temperature operation and the low-temperature operation to support the extended temperature range. By operating differently in the low-temperature operation, the systems and methods extend the operational range of components such as the optical modules 50.

Figure 6:
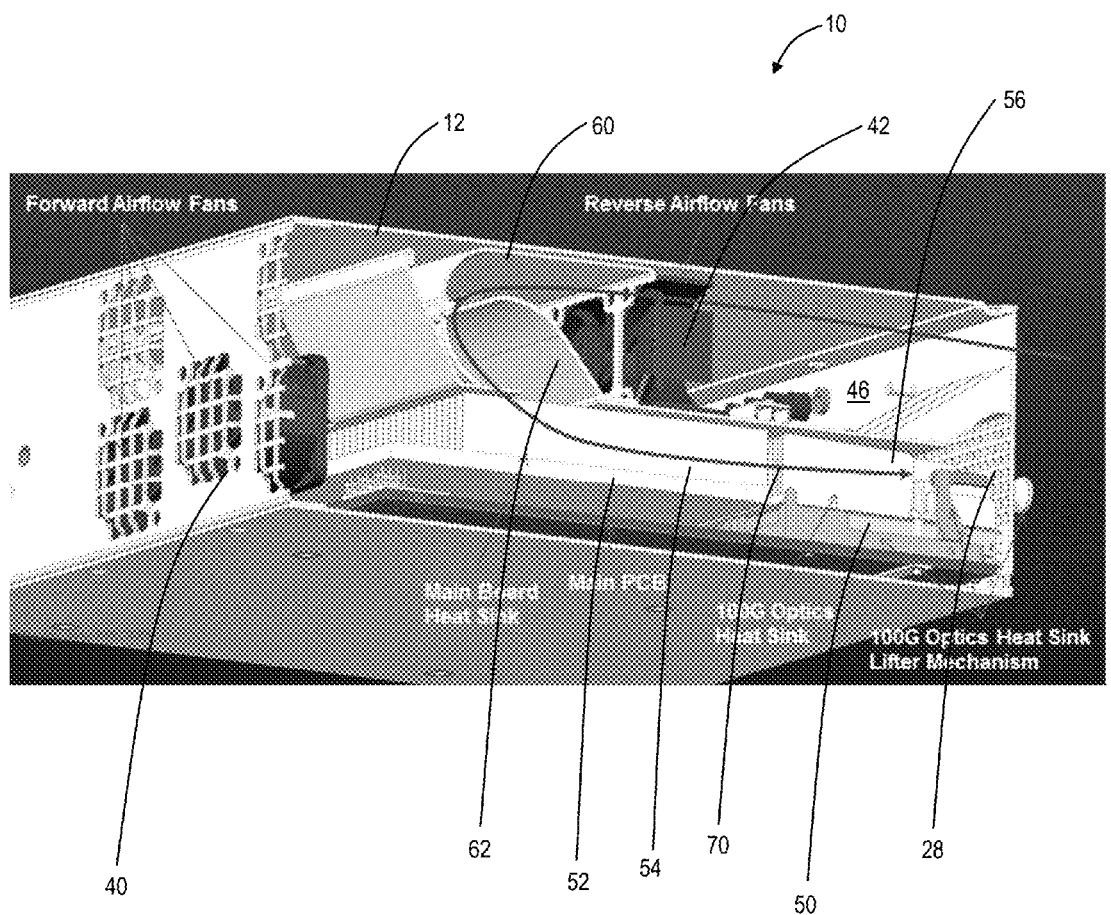
FIG. 6 is a perspective diagram illustrates a cross-sectional side view of the network element of FIG. 1 showing airflow based on the second set of fans.

Referring to FIG. 6, in an exemplary embodiment, a perspective diagram illustrates a cross-sectional side view of the network element 10 showing airflow 70 based on the second set of fans 42. Specifically, FIG. 6 shows how the air is drawn from the interior 46 and the openings 26, 28 by the second set of fans 42 into the air duct 60. The air is turned by the air turning foil 62 and directed over the heatsink 54 associated with the electronics on the circuit board 52. From there, the airflow 70 is heated due to heat generated by the electronics on the circuit board 52 and provided to the heatsink 56 associated with the optical modules 50, thereby providing heat to allow the optical modules 50 to operate in the low-temperature operation, thereby providing operation in the extended temperature range.

In another exemplary embodiment, the network element 10 only includes the first set of fans 40. Here, the second set of fans 42 is physically omitted from the interior 46 along with the air duct 60 and the air turning foil 62. Instead, in the high-temperature operation, the fans 40 are configured to draw ambient air from externally from the network element 10 through the openings 26, 28 and to create airflow through the interior 46 from the front face 14 to the rear section 44. In the low-temperature operation, the fans 40 are reversed and configured to draw ambient air externally from the network element 10 through the rear section to push airflow through the interior. Here, the airflow first goes over the electronics on the circuit board 52 where it heats up before passing over the optical modules 50. Thus, in this exemplary embodiment, the single set of fans 40 is used to have airflow from the front face 14 to the rear section 44 in the high-temperature operation (forward direction) and to have airflow from the rear section 44 to the front face in the low-temperature operation (reverse direction).

In a further exemplary embodiment, the network element 10 can include a heater in the interior 46, associated with either or both of the sets of fans 40, 42. The heater can be used in the low-temperature operation to provide heated air to the optical modules 50 to provide operation in the extended temperature range.

Figure 7:
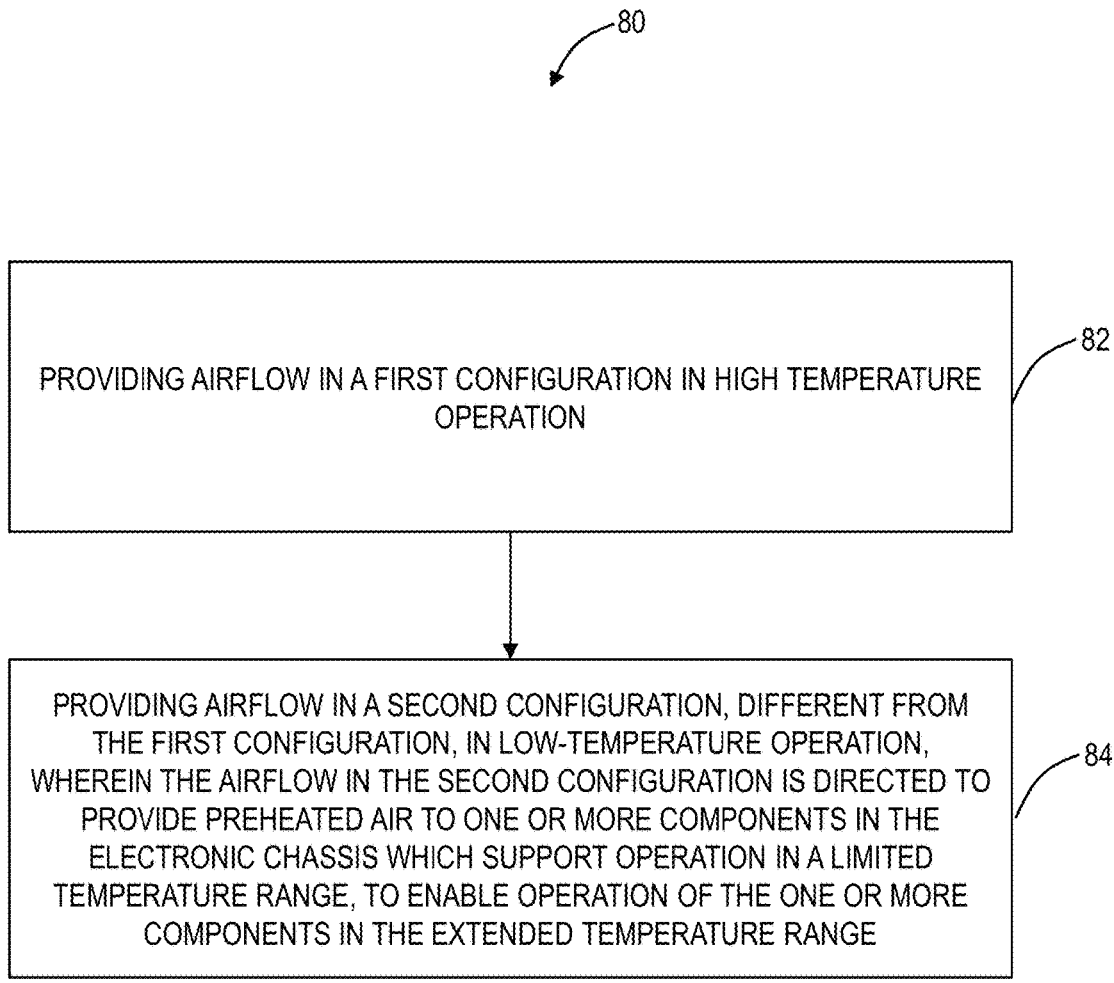
FIG. 7 is a flowchart of a process of providing airflow in an electronic chassis supporting operation in an extended temperature range for components therein.

Referring to FIG. 7, in an exemplary embodiment, a flowchart illustrates a process 80 of providing airflow in an electronic chassis supporting operation in an extended temperature range for components therein. The process 80 includes providing airflow in a first configuration in high-temperature operation (step 82); and providing airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range (step 84). The airflow in the second configuration can be provided first over heat-generation electronics heat before being provided to the one or more components, to heat the one or more components in the low-temperature operation. The airflow in the first configuration can be provided by a first set of fans and the airflow in the second configuration can be provided by a second set of fans.

The first set of fans can be located at a rear section of the electronic chassis and is configured to draw air from a front of the electronic chassis through an interior of the electronic chassis, and the second set of fans can be located in the interior configured to draw air from the interior and exhaust air in the front. The second set of fans can be coupled to an air duct with an air turning foil to guide air firstly over electronics and secondly over the one or more components. The airflow in the first configuration can be provided by a set of fans operating in a forward direction and the airflow in the second configuration can be provided by the set of fans operating in a reverse direction. The one or more components can include optical modules including one of a C Small Form Factor Pluggable 4 (CFP4) and a Quad Small Form Factor Pluggable (QSFP). The preheated air can be preheated by one or more of electronics in the electronic chassis and a heater. The limited temperature range is a smaller range than the extended temperature range, and the second configuration extends the limited temperature range to the extended temperature range.

In another exemplary embodiment, an electronic chassis adapted to support operation in an extended temperature range for components therein includes a first set of fans adapted to provide airflow in a first configuration in high-temperature operation; and a second set of fans adapted to provide airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range. The airflow in the second configuration can be provided first over heat-generating electronics before being provided to the one or more components, to heat the one or more components in the low-temperature operation. The first set of fans can be located at a rear section of the electronic chassis configured to draw air from a front of the electronic chassis through an interior of the electronic chassis, and the second set of fans can be located in the interior configured to draw air from the interior and exhaust air in the front.

The second set of fans can be coupled to an air duct with an air turning foil to guide air first over electronics and second over the one or more components. The one or more components can include optical modules including one of a C Small Form Factor Pluggable 4 (CFP4) and a Quad Small Form Factor Pluggable (QSFP). The preheated air can be preheated by one or more of electronics in the electronic chassis and a heater. The one or more components can support operation in a limited temperature range which is a smaller range than the extended temperature range, and the second configuration extends the limited temperature range to the extended temperature range.

In another exemplary embodiment, an apparatus adapted to provide airflow in an electronic chassis, supporting operation in an extended temperature range for components therein, circuitry adapted to cause airflow in a first configuration in high-temperature operation; and circuitry adapted to cause airflow in a second configuration, different from the first configuration, in low-temperature operation, wherein the airflow in the second configuration is directed to provide preheated air to one or more components in the electronic chassis which support operation in a limited temperature range, to enable operation of the one or more components in the extended temperature range. The airflow in the second configuration can be provided first over heat-generating electronics before being provided to the one or more components, to heat the one or more components in the low-temperature operation. The airflow in the first configuration can be provided by a first set of fans and the airflow in the second configuration can be provided by a second set of fans. The airflow in the first configuration can be provided by a set of fans operating in a forward direction and the airflow in the second configuration can be provided by the set of fans operating in a reverse direction.

It will be appreciated that some exemplary embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the exemplary embodiments described herein, a corresponding device such as hardware, software, firmware, and a combination thereof can be referred to as "circuitry configured or adapted to," "logic configured or adapted to," etc. perform a set of operations, steps, methods, processes, algorithms, functions, techniques, etc. as described herein for the various exemplary embodiments.

Moreover, some exemplary embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various exemplary embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method of providing airflow in an electronic chassis supporting operation in an extended temperature range for components therein, the method comprising:
providing airflow in a first configuration in high-temperature operation; and
providing airflow in a second configuration, different from the first configuration, in low-temperature operation, wherein the airflow in the second configuration is directed to provide preheated air to one or more components in the electronic chassis that operate in a limited temperature range, to enable operation of the one or more components in the extended temperature range;
wherein the limited temperature range is a smaller range than the extended temperature range, and wherein the second configuration extends the operation of the one or more components from the limited temperature range to the extended temperature range.

2. The method of claim 1, wherein the airflow in the second configuration is provided first over heat-generating electronics before being provided to the one or more components, to heat the one or more components in the low-temperature operation.

3. The method of claim 1, wherein the airflow in the first configuration is provided by a first set of fans and the airflow in the second configuration is provided by a second set of fans.

4. The method of claim 3, wherein the first set of fans are located at a rear section of the electronic chassis and is configured to draw air from a front of the electronic chassis through an interior of the electronic chassis, and wherein the second set of fans are located in the interior configured to draw air from the interior and exhaust air in the front.

5. The method of claim 3, wherein the second set of fans are coupled to an air duct with an air turning foil to guide air firstly over heat-generating electronics and secondly over the one or more components.

6. The method of claim 1, wherein the airflow in the first configuration is provided by a set of fans operating in a forward direction and the airflow in the second configuration is provided by the set of fans operating in a reverse direction.

7. The method of claim 1, wherein the one or more components comprise optical modules comprising one of a C Small Form Factor Pluggable 4 (CFP4) and a Quad Small Form Factor Pluggable (QSFP).

8. The method of claim 1, wherein the preheated air is preheated by one or more of electronics in the electronic chassis and a heater.

9. An electronic chassis adapted to support operation in an extended temperature range for components therein, the electronic chassis comprising:
a first set of fans adapted to provide airflow in a first configuration in high-temperature operation; and
a second set of fans adapted to provide airflow in a second configuration, different from the first configuration, in low-temperature operation, wherein the airflow in the second configuration is directed to provide preheated air to one or more components in the electronic chassis that operate in a limited temperature range, to enable operation of the one or more components in the extended temperature range;
wherein the limited temperature range is a smaller range than the extended temperature range, and wherein the second configuration extends the operation of the one or more components from the limited temperature range to the extended temperature range.

10. The electronic chassis of claim 9, wherein the airflow in the second configuration is provided first over heat-generating electronics before being provided to the one or more components, to heat the one or more components in the low-temperature operation.

11. The electronic chassis of claim 9, wherein the first set of fans are located at a rear section of the electronic chassis and is configured to draw air from a front of the electronic chassis through an interior of the electronic chassis, and wherein the second set of fans are located in the interior configured to draw air from the interior and exhaust air in the front.

12. The electronic chassis of claim 9, wherein the second set of fans are coupled to an air duct with an air turning foil to guide air firstly over heat-generating electronics and secondly over the one or more components.

13. The electronic chassis of claim 9, wherein the one or more components comprise optical modules comprising one of a C Small Form Factor Pluggable 4 (CFP4) and a Quad Small Form Factor Pluggable (QSFP).

14. The electronic chassis of claim 9, wherein the preheated air is preheated by one or more of electronics in the electronic chassis and a heater.

15. An apparatus adapted to provide airflow in an electronic chassis supporting operation in an extended temperature range for components therein, the apparatus comprising:

circuitry adapted to cause airflow in a first configuration in high-temperature operation; and circuitry adapted to cause airflow in a second configuration, different from the first configuration, in low-temperature operation, wherein the airflow in the second configuration is directed to provide preheated air to one or more components in the electronic chassis that operate in a limited temperature range, to enable operation of the one or more components in the extended temperature range;

wherein the limited temperature range is a smaller range than the extended temperature range, and wherein the second configuration extends the operation of the one or more components from the limited temperature range to the extended temperature range.

16. The apparatus of claim 15, wherein the airflow in the second configuration is provided first over heat-generating electronics before being provided to the one or more components, to heat the one or more components in the low-temperature operation.

17. The apparatus of claim 15, wherein the airflow in the first configuration is provided by a first set of fans and the airflow in the second configuration is provided by a second set of fans.

18. The apparatus of claim 15, wherein the airflow in the first configuration is provided by a set of fans operating in a forward direction and the airflow in the second configuration is provided by the set of fans operating in a reverse direction.

\* \* \* \* \*